United States Patent
Cherabuddi et al.

(10) Patent No.: US 6,918,071 B2
(45) Date of Patent: Jul. 12, 2005

(54) YIELD IMPROVEMENT THROUGH PROBE-BASED CACHE SIZE REDUCTION

(75) Inventors: Rajasekhar Cherabuddi, Cupertino, CA (US); Meera Kasinathan, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 741 days.

(21) Appl. No.: 09/839,057

(22) Filed: Apr. 20, 2001

(65) Prior Publication Data

US 2003/0088811 A1 May 8, 2003

(51) Int. Cl.⁷ .............................................. G11C 29/00
(52) U.S. Cl. .................... 714/710; 714/718; 714/721; 714/723; 365/200; 365/201
(58) Field of Search ................................ 714/710, 711, 714/713, 718, 721, 723; 365/200, 201

(56) References Cited

U.S. PATENT DOCUMENTS

| | | | | |
|---|---|---|---|---|
| 4,168,541 A | * | 9/1979 | DeKarske | 365/49 |
| 4,464,717 A | * | 8/1984 | Keeley et al. | 711/122 |
| 5,666,482 A | * | 9/1997 | McClure | 714/8 |
| 5,940,858 A | * | 8/1999 | Green | 711/139 |
| 6,412,051 B1 | * | 6/2002 | Konigsburg et al. | 711/163 |
| 6,671,822 B1 | * | 12/2003 | Asher et al. | 714/8 |
| 6,687,785 B1 | * | 2/2004 | Pereira | 711/108 |

OTHER PUBLICATIONS

Array Word Redundancy Scheme, IBM Technical Disclosure Bulletin, Aug. 1982, vol. 55, Issue 3A, pp. 989–992.*

* cited by examiner

Primary Examiner—Joseph D. Torres
(74) Attorney, Agent, or Firm—William L. Paradice, III; Martine Penilla & Gencarella, LLP

(57) ABSTRACT

A multiple-way cache memory having a plurality of cache blocks and associated tag arrays includes a select circuit that stores way select values for each cache block. The way select values selectively disable one or more cache blocks from participating in cache operations by forcing tag comparisons associated with the disabled cache blocks to a mismatch condition so that the disabled cache blocks will not be selected to provide output data. The remaining enabled cache blocks may be operated as a less-associative cache memory without requiring cache addressing modifications.

12 Claims, 3 Drawing Sheets

YIELD IMPROVEMENT THROUGH PROBE-BASED CACHE SIZE REDUCTION

BACKGROUND

1. Field of Invention

This invention relates generally to microprocessor cache systems and specifically to increasing the yield of such systems.

2. Description of Related Art

A cache is a relatively high-speed, small, local memory which is used to provide a local storage for frequently accessed memory locations of a larger, relatively slow, main memory. By storing the information or a copy of the information locally, the cache is able to intercept memory references and handle them directly without transferring the request to the main memory over the system bus. The result is lower traffic on the system bus and decreased memory latencies.

The efficiency of a central processing unit (CPU) depends, in part, upon the hit ratio of requests to cache memory. That is, if requested data is in the cache, there is a cache hit, and the data is readily available from cache memory. Conversely, if the requested data is not in the cache, there is a cache miss, and the data must be retrieved from main memory. In order to increase cache hit ratios, cache memory size has steadily increased over the years, and now may exceed 1 Megabyte for a level-2 (L2) cache.

Unfortunately, as the size of cache memory increases, so does the likelihood of manufacturing defects that render the cache memory unusable, which in turn undesirably decreases manufacturing yield. Previous attempts to combat the loss of manufacturing yield due to unusable portions of cache memory include well-known redundancy and/or mapping techniques. For example, since the L2 cache now typically occupies as much as one-third of the CPU chip, which increases the chances of manufacturing defects in the L2 cache, redundancy rows are built into the cache so that defective cache lines may be mapped to and thereby replaced by the redundancy rows.

However, the mapping of defective rows to redundancy rows requires redundancy features in both the L2 cache address decoders and the L2 cache controller to facilitate such address mappings. These redundancy features undesirably increase circuit complexity and silicon area. Also, when using such redundancy features, the ability to replace defective cache rows is limited by the number of built-in redundant rows and, therefore, if the cache includes more defective rows than redundant rows, the defects cannot be overcome by the redundancy features, and the chip may not be usable.

SUMMARY

A cache memory and method of operation are disclosed that overcome problems in the art described above by selectively disabling one or more defective cache blocks and operating the remaining non-defective and enabled cache blocks without redundancy address mappings. In accordance with the present invention, a multiple-way cache memory having a plurality of cache blocks and associated tag arrays includes a select circuit that stores way select values for each cache block. The way select values selectively disable one or more cache blocks from participating in cache operations by forcing tag comparisons associated with the disabled cache blocks to a mismatch condition so that the disabled cache blocks will not be selected to provide output data. The remaining enabled cache blocks may be operated as a less-associative cache memory without requiring cache addressing modifications. Thus, for example, in an embodiment having four cache blocks, if one of the cache blocks is disabled, the remaining three cache blocks may be used in a normal manner as a 3-way associative cache memory. By selectively preventing one or more cache blocks from participating in cache operations using forced mismatch conditions, rather than using redundancy techniques that require dynamic address mappings, present embodiments may increase manufacturing yield without requiring expensive redundancy address mapping overhead, thereby reducing circuit complexity and die size.

BRIEF DESCRIPTION OF THE DRAWINGS

Like reference numerals refer to corresponding parts throughout the drawing figures.

DETAILED DESCRIPTION

The present invention is described below with reference to a 4-way associative cache memory for simplicity only. It is to be understood that embodiments of the present invention are equally applicable for improving yield of any multi-way associative cache memory of any size, and to other cache memory architectures. In addition, the particular logic levels assigned to signals discussed herein is arbitrary and, thus, may be reversed where desirable. Accordingly, the present invention is not to be construed as limited to specific examples described herein but rather includes within its scope all embodiments defined by the appended claims.

Figure 1:
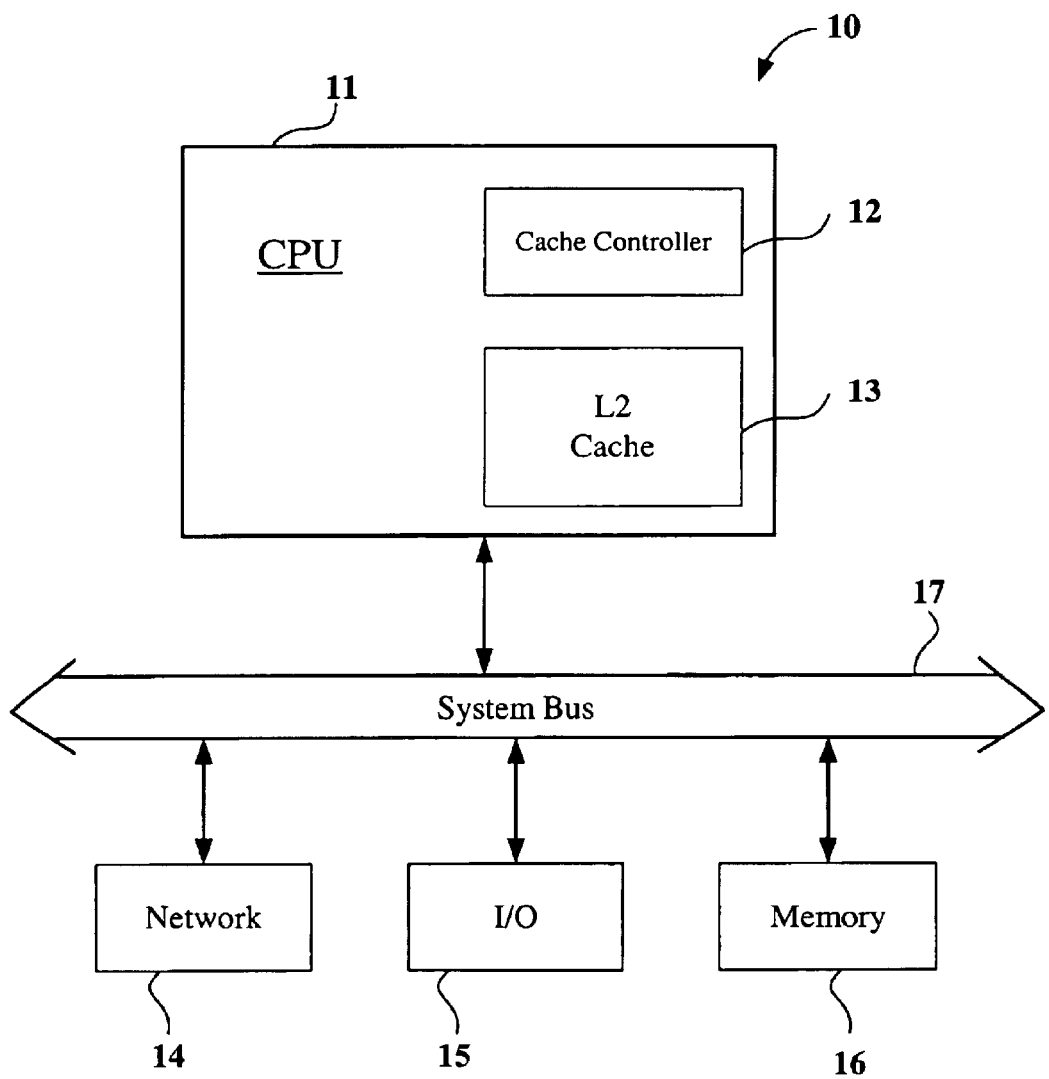
FIG. 1 is a simplified block diagram of a computer system within which embodiments of the present invention may be implemented.

FIG. 1 shows a computer system 10 within which embodiments of the present invention may be implemented. System 10 includes a central processing unit (CPU) 11 having a cache controller 12 that communicates with an on-chip level-2 (L2) cache 13. L2 cache 13 is a multiple-way associative cache memory that stores frequently used data and/or associated instructions for use by CPU 11 in a well-known manner. Preferably, L2 cache 13 is an SRAM cache, although other caches may be used. Although not shown for simplicity, CPU 11 may also include a level-1 (L1) cache. Other well-known elements of CPU 11, such as CPU execution units, fetch circuits, decode circuits, and so on, are not shown for simplicity.

CPU 11 communicates with a network 14, an input/output (I/O) device 15, and a memory 16 via a system bus 17. Network 14 may be any suitable network such as, for example, a local area network, a wide area network, and/or the Internet. I/O device 15 may include, for example, a computer monitor, keyboard, and/or mouse input. The memory 16 is the main memory for CPU 11, and has a relatively large data storage capacity and long access time compared to the L2 cache 13. The memory 16 may be any suitable random access memory (RAM) such as, for example, DRAM. Additional devices may be connected to the system bus 17 as desired.

Figure 2:
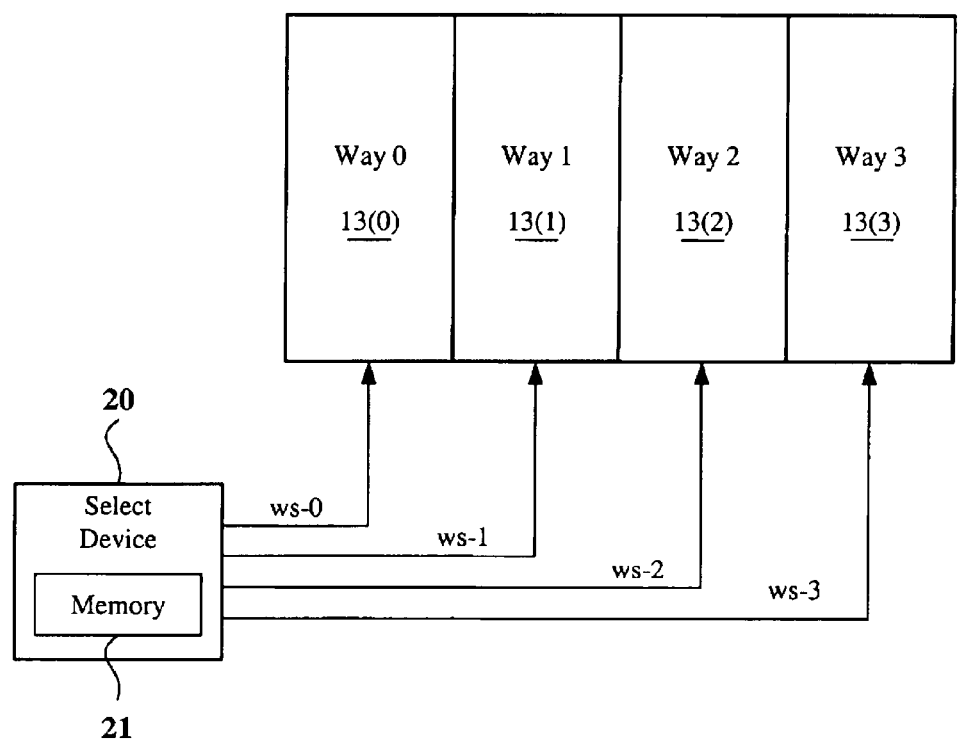
FIG. 2 is a simplified block diagram of a cache memory and associated select circuit in accordance with the present invention.

FIG. 2 shows the L2 cache 13 configured as a 4-way associative cache having four cache blocks 13(0), 13(1), 13(2), and 13(3) corresponding to way 0, way 1, way 2, and way 3, respectively. Each cache block 13(0)–13(3) is a cache array having a number of cache lines for storing a number of data lines retrieved from memory 16. In some embodiments, each cache block 13(0)–13(3) includes one or more redundancy rows and well-known redundancy circuitry. In accordance with the present invention, a select device 20 is provided to selectively disable one or more of the ways of the cache 13. The select device 20 provides four way select signals ws_0 to ws_3 to selectively disable cache blocks 13(0)–13(3), respectively. In one embodiment, a logic high value for a way select signal enables the corresponding cache block, and a logic low value disables the corresponding cache block. When a cache block is disabled by a corresponding way select signal, the cache block does not participate in read or write operations between the CPU 11 and cache 13.

The select device 20 includes a memory device 21 that stores binary values for the way select signals ws_0 to ws_3. The memory device 21 may be any suitable device capable of storing or representing binary values including, for example, fuses or anti-fuses, non-volatile memory cells, latches, flip-flops, and so on. The binary values for the way select signals may be generated in response to testing of the CPU 11. For example, during manufacture of CPU 11, each cache block 13(0)–13(3) is tested for manufacturing defects. If a cache block is not defective, a logic high way select value is stored in the select memory 21 to enable the cache block for cache read operations. Conversely, if a particular cache block is found to contain manufacturing defects that cannot be overcome with any well-known built-in redundancy feature(s), a logic low way select value is stored in the select memory 21 to disable the cache block for cache read operations. The remaining enabled cache blocks may then be operated as a less-associative cache without any changes in cache addressing. For example, if cache block 13(0) is defective and thereafter disabled in accordance with present embodiments, the remaining enabled cache blocks 13(1)–13(3) may operate as a 3-way associative cache; if cache blocks 13(0) and 13(1) are defective and thereafter disabled in accordance with present embodiments, the remaining enabled cache blocks 13(2) and 13(3) may operate as a 2-way associative cache; and so on.

Figure 3:
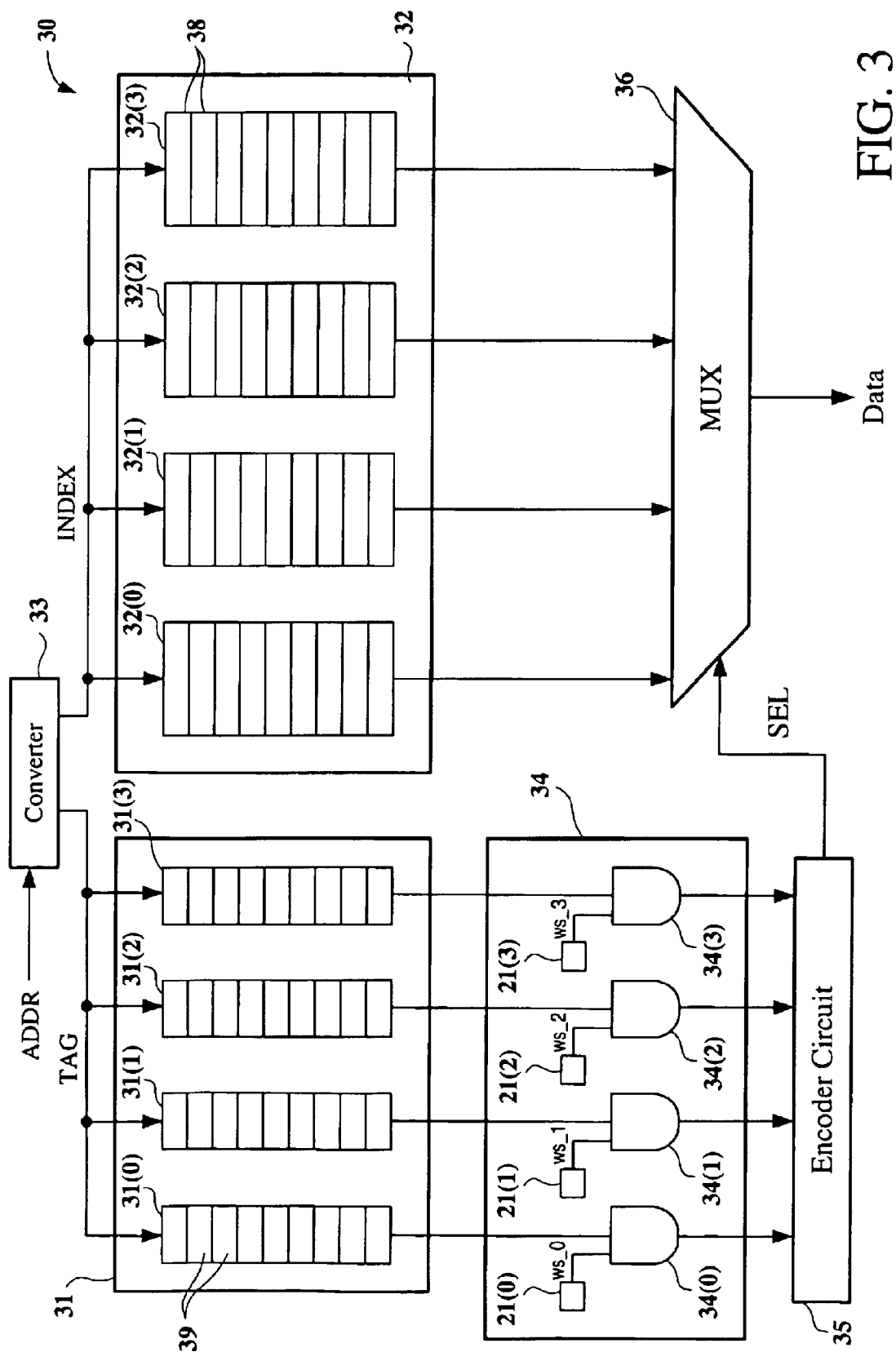
FIG. 3 is a block diagram of a cache memory in accordance with a preferred embodiment of the present invention.

FIG. 3 shows a cache memory 30 that is one embodiment of the cache 13 of FIGS. 1 and 2. The cache 30 is configured as a 4-way associative cache, and includes a tag unit 31, a data unit 32, an address converter 33, a select circuit 34, an encoder circuit 35, and a multiplexer (MUX) 36. When requesting data from the cache 30, the CPU 11 provides a main memory address ADDR to the cache 30 to concurrently address the tag unit 21 and the data unit 32. The main memory address ADDR includes a tag address and a cache index. The address converter 33 provides the tag address to the tag unit 21 and the cache index to the data unit 32. The number of bits in the main memory address ADDR corresponds to the number of address locations in memory 16, while the number of bits in the cache index corresponds to the number of cache lines in the data unit 32. For example, where the data unit 32 includes 256 k cache lines, the cache index includes 18 bits.

The data unit 32 is shown to include 4 data RAM cache blocks 32(0)–32(3), each including a plurality of cache lines 38 for storing lines of data retrieved from main memory 16. In one embodiment, each cache line 38 of a cache block 32(0)–32(3) stores 32 Bytes of contiguously addressable data retrieved from the main memory 16, in which case the cache index includes a 5-bit offset that may be used to individually address the bytes within the cache lines 38. Each cache block 32(0)–32(3) includes a well-known address decoder (not shown for simplicity) that selects a cache line for read and write operations in response to the cache index provided by the address converter 33.

The tag unit 31 includes four tag arrays 31(0)–31(3) that store tag addresses for corresponding cache blocks 32(0)–32(3), respectively. Each tag array 31(0)–31(3) includes a plurality of tag lines 39, one for each cache line 38 in the corresponding cache blocks 32(0)–32(3). For example, the first tag line 39 of tag array 31(0) stores the tag address of the first cache line 38 in corresponding cache block 32(0), the first tag line 39 of tag array 31(1) stores the tag address of the first cache line 38 in corresponding cache block 32(1), and so on. During read and write operations, each tag array 31(0)–31(3) compares a tag address provided by the address converter 33 with its own tag entries 39 to generate a match signal. In one embodiment, a logic high match signal indicates a match condition, and a logic low match signal indicates a mismatch condition.

Select circuit 34, which is one embodiment of select device 20 of FIG. 2, is connected between each tag array 31(0)–31(3) and the encoder circuit 35. Specifically, the select circuit includes four AND gates 34(0)–34(3) to gate match signals from respective tag arrays 31(0)–31(3) with way select signals provided by respective memory devices 21(0)–21(3). The memory devices 21(0)–21(3) form part of the select memory device 21 of FIG. 2, and thus may be any suitable memory device. In one preferred embodiment, memory devices 21(0)–21(3) are fuses, where an intact fuse provides a logic high way select value and a blown fuse provides a logic low way select value. The gated match signals provided by AND gates 34(0)–34(3) are provided as inputs to the encoder circuit 35, which in response thereto provides a select signal SEL to MUX 36 to select a data line from one of the cache blocks 32(0)–32(3) to provide as output data.

Sometime prior to operation of CPU 11, L2 cache blocks 32(0)–32(3) are tested for manufacturing defects. If a cache block 32(0)–32(3) is found to be defective, e.g., containing more defective cache lines than redundancy lines, the cache block's corresponding way select signal is forced to the logic low state to disable the cache block. For purposes of discussion herein, cache block 32(0) is found to be defective, and cache blocks 32(1)–32(3) are found to be non-defective. Accordingly, a logic low value for way select signal ws_0 is stored in memory 21(0), e.g., by blowing its fuse, to disable cache block 32(0), and logic high values for way select signals ws_1 to ws_3 are stored in memories 21(1)–21(3) to enable respective cache blocks 32(1)–32(3). In this example, with cache block 32(0) disabled, cache 30 operates as a 3-way associative cache memory.

During operation of the computer system 10, requests for data in the main memory 16 are first processed in L2 cache 30. If the requested data is stored in the L2 cache 30, there is as a cache hit, and the CPU 11 uses the data stored in the L2 cache 30 directly. Otherwise, if the data is not stored in the L2 cache 30, there is a cache miss, and the data is retrieved from the main memory 16, and thereafter stored in the L2 cache 30. A cache line 38 in cache blocks 32(0)–32(3) is selected for replacement using any well-known cache replacement algorithm. In one embodiment, a least recently used (LRU) cache replacement algorithm is used. If data selected for replacement has been modified, i.e., different from original data in the main memory 16, the selected data is written back to the main memory 16 before replacement.

To process an address request from the CPU 11, the address converter 33 converts the main memory address ADDR into its tag address and cache index. The cache index is used to simultaneously access a selected cache line 38 of each cache block 32(0)–32(3). In response thereto, all cache blocks, including the disabled cache block 32(0), read out their selected cache line to MUX 36. Concurrently, the tag address is provided to each tag array 31(0)–31(3) and compared with tag entries 39 therein to generate corresponding match signals. The logic high way select signals ws_1 to ws_3 provided to AND gates 34(1)–34(3) cause AND gates 34(1)–34(3) to pass match signals from respective tag arrays 31(1)–31(3) to the encoder circuit 35. The low logic way select signal ws_0 provided to AND gate 34(0) forces the output of AND gate 34(0) to logic low, thereby forcing a mismatch condition for tag array 31(0). In response to these gated match signals, the encoder circuit 35 generates SEL to select the output of the cache block that corresponds to the matching tag address (if any). For example, if the tag address provided by the address converter 33 matches a tag entry 39 in tag array 31(1), the encoder circuit 35 generates a select signal SEL that selects corresponding cache block 32(1). If there is not a matching tag entry 39 in any of the tag arrays 31(0)–31(3), the encoder circuit 35 disables MUX 36 so that no output data is provided.

Because the match signal from tag array 31(0) is forced to the mismatch condition via AND gate 34(0), the encoder circuit 35 never selects the disabled cache block 32(0) to provide its data as output data via MUX 36, irrespective of whether the requested tag address matches entries (if any) in tag array 32(0). In this manner, the select circuit 34 prevents the disabled cache block 32(0) from participating in cache read operations by ensuring that cache block 32(0) is never selected to provide the output data. The remaining enabled cache blocks 32(1)–32(3) may be individually selected to provide output data for a cache read operation according to match signals provided by corresponding tag arrays 31(1)–31(3), respectively. Therefore, in this example, the cache 30 may be operated as a 3-way associative cache memory.

Of course, if two cache blocks are found to be defective, they may be disabled in the manner described above, and the remaining two enabled cache blocks may operate as a two-way associative cache memory. Similarly, if three cache blocks are found to be defective, they may be disabled in the manner described above, and the remaining one enable cache block may be operated as a direct-mapped cache memory.

By selectively disabling one or more cache blocks of the cache 30, the present invention allows the remaining, non-defective cache blocks to be used, thereby salvaging an otherwise unusable cache memory, which in turn advantageously increases manufacturing yield. Further, in contrast to prior techniques for using only non-defective portions of cache memory, embodiments of the present invention do not require any address modifications to map defective areas to non-defective areas, and therefore do not require expensive redundancy overhead associated with mapping such address modifications in address decoders for the cache 30 or in the cache controller 12. Indeed, the disabling of one or more defective cache blocks in accordance with the present invention is invisible to address decoders associated with the cache 30 and to the cache controller 12, and therefore requires no cache address mappings or modifications.

Further, in contrast to row redundancy techniques, the ability of present embodiments to sector out defective cache areas is not dependent upon redundant rows and circuitry, but is rather defined by the ways or cache block boundaries. Thus, for example, if there are manufacturing defects in cache block 32(0), the cache block 32(0) can be disabled and thereby effectively removed from the cache system, irrespective of the number of cache lines actually defective. This further increases yield compared to row redundancy schemes where if there are more defective rows than replacement rows in any of the ways, the entire cache is not used.

During write operations to the cache 30, e.g., when it is desired to replace data in a cache line 38 with new data, the new data must not be written to the disabled cache block 32(0), since as described above the disabled cache block 32(0) is never selected for read operations, and thus any data in the defective cache block 32(0) is inaccessible. In some embodiments, the disabled cache block 32(0) is prevented from participating in cache write operations by the cache controller 12. In one embodiment, the cache replacement algorithm is configured so that cache block 32(0) is never selected for replacement. Since the disabled cache blocks are prevented from being selected during cache write operations by modifying the cache replacement algorithm, no additional circuitry overhead is required.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

We claim:

1. A method of improving yield in a multiple way associative cache memory having a plurality of cache blocks and a plurality of tag arrays each corresponding to one of the multiple ways, the method comprising:

determining whether a defect exists in any of the cache blocks;

for each way, storing, in a memory device separate from said tag arrays, a way select value indicative of whether the corresponding cache block is defective, and for each way, selectively disabling the way if the corresponding cache block is defective by passing a match signal from each tag array through a select device, said select device forcing said match signal to indicate a mismatch condition in response to a corresponding one of said way select values.

2. The method of claim 1, wherein:

when one or more of said cache blocks are disabled, operating the remaining, non-disabled cache blocks as a less-associative cache memory.

3. The method of claim 1, wherein said selectively disabling further comprises:

comparing a requested tag address with a tag stored in each said tag array;

generating, said match signal indicative of results of said comparing; and gating each said match signals with said corresponding way select value to force the mismatch condition for comparison results of a disabled cache block.

4. The method of claim 1, wherein during a cache write operation the disabling step comprises:

configuring a cache replacement algorithm to never select the disabled cache block.

5. A method of improving yield in an N way associative cache memory having N cache blocks and N tag arrays corresponding to the N ways, the method comprising:

determining whether a defect exists in a cache block;

for each way, storing, in a memory device separate from said N tag arrays, a way select value indicative of whether the corresponding cache block is defective;

for each way, disabling the way when a corresponding one of said way select values indicates a defective cache block by passing a match signal from each tag array through a select device, said select device selectively forcing said match signal to indicate a mismatch condition; and operating remaining cache blocks as an N-1 way associative cache memory.

6. The method of claim 5, wherein said disabling further comprises:

comparing a requested tag address with a tag stored in each said tag array;

generating said match signal in response to said comparing; and gating the match signal with said corresponding way select value to selectively force the mismatch condition.

7. A multiple-way associative cache memory, comprising:

a plurality of cache blocks, each having a number of cache lines to store data;

a plurality of tag arrays, each storing a number of tags for associated data in a corresponding one of the plurality of cache blocks; and select means receiving a match signal from each said tag array, said select means comprising a memory device separate from said tag arrays that stores a way select value for each said cache block, each said way select values being indicative of whether a corresponding one of said cache blocks is defective, the select means configured to selectively disable one or more of the cache blocks by forcing said match signal to indicate a mismatch condition for each tag array corresponding to cache blocks indicated by said way select value as being defective.

8. The cache memory of claim 7, wherein the select means further comprises a plurality of gating circuits, each having a first input terminal coupled to receive said match signal from a corresponding one of said tag arrays, a second input terminal coupled to receive a corresponding one of said way select values, and an output terminal thereby providing a gated match signal for a corresponding one of said cache blocks.

9. The cache memory of claim 8, further comprising:

an encoder circuit having a plurality of input terminals coupled to receive the gated match signals for corresponding cache blocks, and having an output terminal to provide a select signal; and a multiplexer having a plurality of input terminals coupled to receive data from corresponding cache blocks, an output terminal to provide output data, and a control terminal to receive the select signal.

10. The cache memory of claim 9, wherein the select signal selects which cache block provides its data as the output data.

11. The cache memory of claim 8, wherein the gating circuits comprise AND gates.

12. The cache memory of claim 7, wherein the memory devices comprises fuses.

* * * * *